(12) United States Patent
Kim et al.

(10) Patent No.: US 10,494,483 B2
(45) Date of Patent: Dec. 3, 2019

(54) PHOTOSENSITIVE RESIN COMPOSITION, ORGANIC LIGHT EMITTING DISPLAY DEVICE INCLUDING THE SAME, AND METHOD FOR MANUFACTURING ORGANIC LIGHT EMITTING DISPLAY DEVICE

(71) Applicants: SAMSUNG DISPLAY CO., LTD., Yongin-si, Gyeonggi-do (KR); LTC Co., Ltd., Anyang-si, Gyeonggi-do (KR)

(72) Inventors: Jeong Won Kim, Seoul (KR); Jun Hyuk Woo, Seongnam-si (KR); Jin Ho Ju, Seoul (KR); Beung Hwa Jeong, Cheonan-si (KR); Jun-young Kim, Anyang-si (KR); Hwa-young Kim, Anyang-si (KR); Ho-Sung Choi, Anyang-si (KR)

(73) Assignees: Samsung Display Co., Ltd., Yongin-si (KR); LTC Co., Ltd., Anyang-si (KR)

( * ) Notice: Subject to any disclaimer, the term of this patent is extended or adjusted under 35 U.S.C. 154(b) by 244 days.

(21) Appl. No.: 15/417,275

(22) Filed: Jan. 27, 2017

(65) Prior Publication Data
US 2017/0226294 A1 Aug. 10, 2017

(30) Foreign Application Priority Data

Feb. 5, 2016 (KR) .................. 10-2016-0015304

(51) Int. Cl.
| | | |
|---|---|---|
| *G03F 7/004* | (2006.01) | |
| *H01L 27/32* | (2006.01) | |
| *C08G 77/16* | (2006.01) | |
| *G03F 7/039* | (2006.01) | |
| *G03F 7/075* | (2006.01) | |
| *H01L 51/56* | (2006.01) | |
| *G03F 7/023* | (2006.01) | |
| *C08L 83/14* | (2006.01) | |
| *H01L 51/50* | (2006.01) | |
| *C08G 77/04* | (2006.01) | |
| *H01L 21/02* | (2006.01) | |
| *H01L 21/027* | (2006.01) | |
| *H01L 21/311* | (2006.01) | |
| *C08G 77/52* | (2006.01) | |

(52) U.S. Cl.
CPC .............. *C08G 77/16* (2013.01); *C08L 83/14* (2013.01); *G03F 7/0233* (2013.01); *G03F 7/039* (2013.01); *G03F 7/0757* (2013.01); *H01L 27/3246* (2013.01); *H01L 27/3262* (2013.01); *H01L 51/56* (2013.01); *C08G 77/045* (2013.01); *C08G 77/52* (2013.01); *H01L 21/0271* (2013.01); *H01L 21/02126* (2013.01); *H01L 21/311* (2013.01); *H01L 51/5012* (2013.01); *H01L 2227/323* (2013.01)

(58) Field of Classification Search
CPC ........ G03F 7/039; G03F 7/0757; C08L 83/04; C08G 77/04; C08G 77/16; H01L 27/0757; H01L 27/3246; H01L 51/5012; H01L 51/56
USPC ..................................................... 430/270.1
See application file for complete search history.

(56) References Cited

FOREIGN PATENT DOCUMENTS

| JP | 2006-245525 A | 9/2006 |
|---|---|---|
| KR | 10-2004-0051072 A | 6/2004 |
| KR | 10-2006-0116701 A | 11/2006 |
| KR | 10-2006-0121115 A | 11/2006 |
| KR | 2013-0113635 A * | 10/2013 |
| KR | 10-2015-0098355 A | 8/2015 |

OTHER PUBLICATIONS

Computer-generated translation of KR 2013-0113635 (Oct. 2013). (Year: 2013).*
Keun-Byoung Yoon and Dong-Ho Lee, "Preparation and Characterization of Functional Polymers Containing POSS", Polymer Science and Technology, vol. 16, No. 6, Dec. 2005, pp. 833-842.

* cited by examiner

*Primary Examiner* — John A McPherson
(74) *Attorney, Agent, or Firm* — Lewis Roca Rothgerber Christie LLP

(57) ABSTRACT

A photosensitive resin composition, an organic light emitting display device, and method for manufacturing an organic light emitting device, the composition including a photosensitive compound; a solvent; and a silsesquioxane-based copolymer, the silsesquioxane-based copolymer being obtained by copolymerizing a compound represented by the following Chemical Formula 1 with at least one of a compound represented by the following Chemical Formula 2, and a compound represented by the following Chemical Formula 3;

$R_1-R_2-Si(R_3)_3$        [Chemical Formula 1]

$R_4-Si(R_5)_3$        [Chemical Formula 2]

$Si(R_6)_4$.        [Chemical Formula 3]

20 Claims, 13 Drawing Sheets

PHOTOSENSITIVE RESIN COMPOSITION, ORGANIC LIGHT EMITTING DISPLAY DEVICE INCLUDING THE SAME, AND METHOD FOR MANUFACTURING ORGANIC LIGHT EMITTING DISPLAY DEVICE

CROSS-REFERENCE TO RELATED APPLICATION

Korean Patent Application No. 10-2016-0015304, filed on Feb. 5, 2016, in the Korean Intellectual Property Office, and entitled: "Photosensitive Resin Composition, Organic Light Emitting Display Device Including the Same, and Method for Manufacturing Organic Light Emitting Display Device," is incorporated by reference herein in its entirety.

BACKGROUND

1. Field

Embodiments relate to a photosensitive resin composition, an organic light emitting display device including the same, and a manufacturing method of the organic light emitting display device.

2. Description of the Related Art

Display devices display images, and the organic light emitting display device among them has been in the spotlight.

The organic light emitting display device has a self-luminance characteristic and does not require a separate light source, unlike a liquid crystal display (LCD) device, and thus may have reduced thickness and weight. The organic light emitting display device represents high quality characteristics of low power consumption, high luminance, and a high reaction speed.

The above information disclosed in this Background section is only for enhancement of understanding of the background of the invention and therefore it may contain information that does not form the prior art that is already known in this country to a person of ordinary skill in the art.

SUMMARY

Embodiments are directed to a photosensitive resin composition, an organic light emitting display device including the same, and a manufacturing method of the organic light emitting display device.

The embodiments may be realized by providing a photosensitive resin composition including a photosensitive compound; a solvent; and a silsesquioxane-based copolymer, the silsesquioxane-based copolymer being obtained by copolymerizing a compound represented by the following Chemical Formula 1 with at least one of a compound represented by the following Chemical Formula 2, and a compound represented by the following Chemical Formula 3;

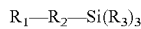   [Chemical Formula 1]

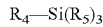   [Chemical Formula 2]

   [Chemical Formula 3]

wherein, in Chemical Formulae 1 to 3, $R_1$ is an amino group, a hydroxyl group, or a carboxyl group, $R_2$ is a linear or branched and substituted or unsubstituted alkylene group having 1 to 5 carbon atoms, $R_3$, $R_5$, and $R_6$ are each independently a substituted or unsubstituted alkoxy group having 1 to 4 carbon atoms, $R_4$ is a linear or branched and substituted or unsubstituted alkylene group having 1 to 5 carbon atoms, a substituted or unsubstituted aromatic hydrocarbon group having 6 to 18 carbon atoms, or a substituted or unsubstituted cyclic hydrocarbon group having 3 to 8 carbon atoms.

The silsesquioxane-based copolymer may have a weight average molecular weight (Mw) of 2,000 to 10,000.

The silsesquioxane-based copolymer may have a degree of dispersion of 1.5 to 5.0.

The silsesquioxane-based copolymer may have an acid number of 30 to 300 KOH mg/g.

The composition may include 20 to 50 wt % of the silsesquioxane-based copolymer, 20 to 30 wt % of the photosensitive compound, and 20 to 60 wt % of the solvent.

The photosensitive resin composition may have a glass transition temperature (Tg) of 150° C. to 200° C.

The photosensitive resin composition may have viscosity of 3 to 30 Cp.

The compound represented by Chemical Formula 1 may be (3-aminopropyl)triethoxysilane.

The compound represented by Chemical Formula 2 may include phenyltrimethoxysilane or methyltriethoxysilane.

The compound represented by Chemical Formula 3 may be tetraethoxysilane.

The photosensitive compound may include a ballast selected from 2,3,4-trihydroxybenzophenone, 2,4,4'-trihydroxybenzophenone, 2,4,6-trihydroxybenzophenone, 2,3,4-trihydroxy-2'-methylbenzophenone, 2,2',4,4'-tetrahydroxybenzophenone, 2,3,4,4'-tetrahydroxybenzophenone, 4,4',4"-trihydroxyphenylmethane, bis-(4-hydroxyphenyl)methylphenylmethane, 1,1,4-tris-(4-hydroxyphenyl)cyclohexane, 2,2',3,4,4'-pentahydroxybenzophenone, 2,2',3,4,4',5-hexahydroxybenzophenone, 1,2-benzenediol, and 4-[bis-(5-cyclohexyl-4-hydroxy-2-methylphenyl)methyl], the ballast being substituted with naphthoquinone-1, a 2-diazide-4-sulfonate ester group, or a naphthoquinone-1,2-diazide-5-sulfonate ester group.

The solvent may include butyl acetate, diethylene glycol dimethyl ethyl ether, methyl methoxy propionate, ethyl ethoxy propionate, ethyl lactate, propylene glycol methyl ether acetate, propylene glycol methyl ether, propylene glycol propyl ether, methyl cellosolve acetate, ethyl cellosolve acetate, diethylene glycol methyl acetate, diethylene glycol ethyl acetate, diethylene glycol ethyl ether, or dipropylene glycol methyl ether.

The silsesquioxane-based copolymer may have a random structure.

The embodiments may be realized by providing an organic light emitting display device including a first electrode electrically connected to a thin film transistor; a second electrode overlapping the first electrode; a pixel defining layer between the first electrode and the second electrode, the pixel defining layer having an opening overlapping the first electrode; and an emission layer between the first electrode and the second electrode in the opening, wherein the pixel defining layer includes a silsesquioxane-based copolymer obtained by copolymerizing a compound represented by the following Chemical Formula 1 with at least one of a compound represented by the following Chemical Formula 2, and a compound represented by the following Chemical Formula 3:

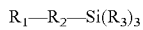   [Chemical Formula 1]

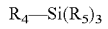   [Chemical Formula 2]

   [Chemical Formula 3]

wherein, in Chemical Formulae 1 to 3, $R_1$ is an amino group, a hydroxyl group, or a carboxyl group, $R_2$ is a linear or branched and substituted or unsubstituted alkylene group having 1 to 5 carbon atoms, $R_3$, $R_5$, and $R_6$ are each independently a substituted or unsubstituted alkoxy group having 1 to 4 carbon atoms, $R_4$ is a linear or branched and substituted or unsubstituted alkylene group having 1 to 5 carbon atoms, a substituted or unsubstituted aromatic hydrocarbon group having 6 to 18 carbon atoms, or a substituted or unsubstituted cyclic hydrocarbon group having 3 to 8 carbon atoms.

The pixel defining layer may cover an edge of the first electrode.

The silsesquioxane-based copolymer may have a weight average molecular weight (Mw) of 2,000 to 10,000, a degree of dispersion of 1.5 to 5.0, and an acid number of 30 to 300 KOH mg/g.

The embodiments may be realized by providing a method for manufacturing an organic light emitting display device, the method including applying a photosensitive resin composition on a first electrode material layer to form a photosensitive resin layer; patterning the photosensitive resin layer to form the photosensitive resin layer pattern; patterning the first electrode material layer by using the photosensitive resin layer pattern as a mask to form a first electrode; and forming a pixel defining layer covering an edge of the first electrode by heating the photosensitive resin layer pattern, wherein the photosensitive resin composition includes a photosensitive compound; a solvent; and a silsesquioxane-based copolymer, the silsesquioxane-based copolymer being obtained by copolymerizing a compound represented by the following Chemical Formula 1 with at least one of a compound represented by the following Chemical Formula 2, and a compound represented by the following Chemical Formula 3;

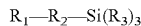
[Chemical Formula 1]

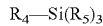
[Chemical Formula 2]

[Chemical Formula 3]

wherein, in Chemical Formulae 1 to 3, $R_1$ is an amino group, a hydroxyl group, or a carboxyl group, $R_2$ is a linear or branched and substituted or unsubstituted alkylene group having 1 to 5 carbon atoms, $R_3$, $R_5$, and $R_6$ are each independently a substituted or unsubstituted alkoxy group having 1 to 4 carbon atoms, $R_4$ is a linear or branched and substituted or unsubstituted alkylene group having 1 to 5 carbon atoms, a substituted or unsubstituted aromatic hydrocarbon group having 6 to 18 carbon atoms, or a substituted or unsubstituted cyclic hydrocarbon group having 3 to 8 carbon atoms.

The heating may be performed at a temperature of 200° C. to 250° C. for one hour.

The patterning of the photosensitive resin layer may be performed by using a mask, the mask including a first light transmitting portion allowing about 100% of light to pass therethrough, a second light transmitting portion allowing about 50% of light to pass therethrough, and a light blocking portion blocking light from passing therethrough.

The first electrode material layer and the photosensitive resin layer may be entirely removed in a portion aligned with the first light transmitting portion; the photosensitive resin layer may be removed to expose the first electrode in a portion aligned with the second light transmitting portion; and the photosensitive resin layer may remain in a portion aligned the light blocking portion.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
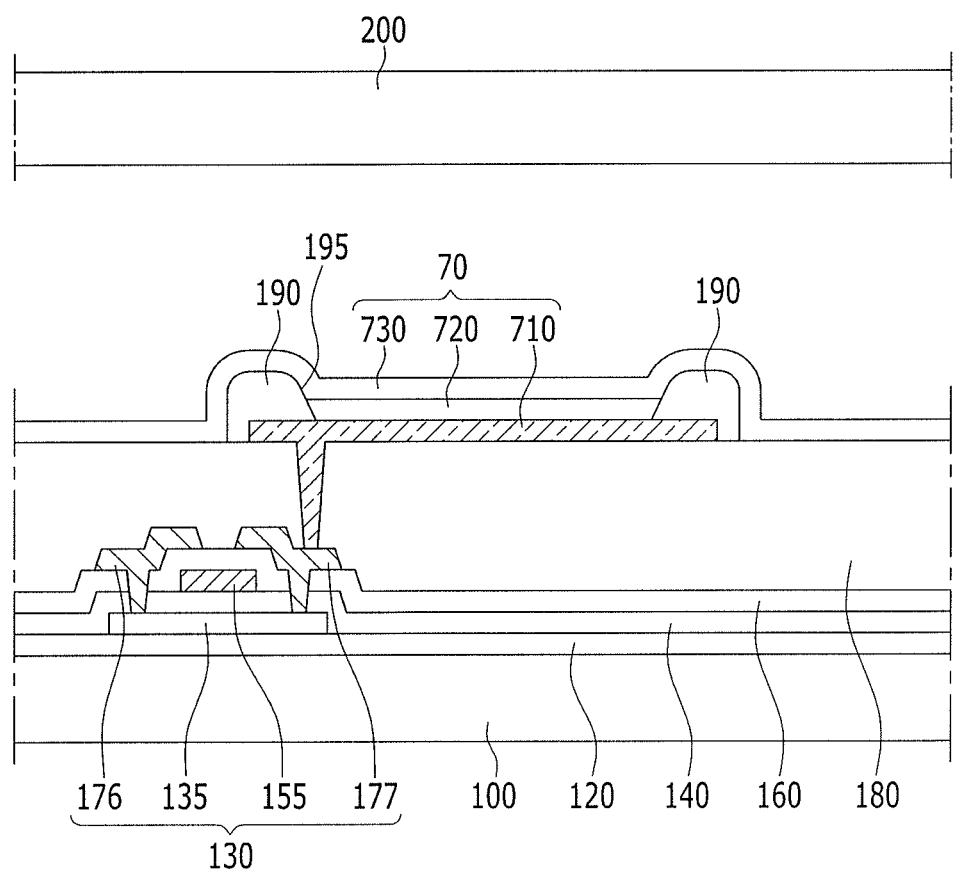
FIG. 1 illustrates a cross-sectional view of one pixel of the organic light emitting display device of an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

The size and thickness of each component illustrated in the drawings are arbitrarily illustrated in the drawings for better understanding and ease of description.

The thicknesses of the layers, films, panels, regions, etc., are enlarged in the drawings for better understanding and ease of description. It will be understood that when an element such as a layer, film, region, or substrate is referred to as being "on" another element, it can be directly on the other element or intervening elements may also be present.

In addition, unless explicitly described to the contrary, the word "comprise" and variations such as "includes," "comprises," or "comprising" will be understood to imply the inclusion of stated elements but not the exclusion of any other elements. The term "or" is not an exclusive term, e.g., "A or B" would include A, B, or A and B. Throughout this specification, it is understood that the term "on" and similar terms are used generally and are not necessarily related to a gravitational reference.

First, a photosensitive resin composition according to an exemplary embodiment will be described.

The photosensitive resin composition according to the exemplary embodiment may include, e.g., (a) a silsesquioxane-based copolymer obtained by copolymerizing a compound represented by the following Chemical Formula 1 with at least one of a compound represented by the following Chemical Formula 2 and a compound represented by the following Chemical Formula 3, (b) a photosensitive compound, and (c) a solvent.

[Chemical Formula 1]

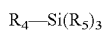
[Chemical Formula 2]

[Chemical Formula 3]

In Chemical Formulae 1 to 3, $R_1$ may be or may include, e.g., an amino group, a hydroxyl group, or a carboxyl group, $R_2$ may be or may include, e.g., a linear or branched and substituted or unsubstituted alkylene group having 1 to 5 carbon atoms, $R_3$, $R_5$, and $R_6$ may each independently be or include, e.g., a substituted or unsubstituted alkoxy group having 1 to 4 carbon atoms, and $R_4$ may be or may include, e.g., a linear or branched and substituted or unsubstituted alkylene group having 1 to 5 carbon atoms, a substituted or unsubstituted aromatic hydrocarbon group having 6 to 18 carbon atoms, or a substituted or unsubstituted cyclic hydrocarbon group having 3 to 8 carbon atoms.

The photosensitive resin composition may include, e.g., 20 to 50 wt % of the silsesquioxane-based copolymer, 20 to 30 wt % of the photosensitive compound, and 20 to 60 wt % of the solvent, based on a total weight of the composition.

In an implementation, the silsesquioxane-based copolymer according to the exemplary embodiment may be obtained by copolymerizing a compound represented by the following Chemical Formula 1 with a compound represented by the following Chemical Formula 2, by copolymerizing a compound represented by the following Chemical Formula 1 with a compound represented by the following Chemical Formula 3, or by copolymerizing a compound represented by the following Chemical Formula 1 with a compound represented by the following Chemical Formula 2 and a compound represented by the following Chemical Formula 3.

$R_1$—$R_2$—$Si(R_3)_3$         [Chemical Formula 1]

$R_4$—$Si(R_5)_3$         [Chemical Formula 2]

$Si(R_6)_4$         [Chemical Formula 3]

In Chemical Formula 1, $R_1$ may be an alkali soluble component, and may include a hydrophilic group. $R_1$ may be or may include, e.g., an amino group, a hydroxyl group, or a carboxyl group. In an implementation, $R_1$ may be an amino group.

In Chemical Formula 1, $R_2$ may be or may include, e.g., a linear or branched and substituted or unsubstituted alkylene group having 1 to 5 carbon atoms. In an implementation, $R_2$ may be, e.g., an ethylene group or a propylene group.

In Chemical Formula 1, $R_3$ may be, e.g., a substituted or unsubstituted alkoxy group having 1 to 4 carbon atoms. In an implementation, $R_3$ may be, e.g., a methoxy group or an ethoxy group.

In an implementation, the compound represented by Chemical Formula 1 may be, e.g., (3-aminopropyl)triethoxysilane.

The compound represented by Chemical Formula 2 may be a component included for adjusting a developing speed, and may include, e.g., a hydrophobic group.

In Chemical Formula 2, $R_4$ may be or may include, e.g., a linear or branched and substituted or unsubstituted alkylene group having 1 to 5 carbon atoms, a substituted or unsubstituted aromatic hydrocarbon group having 6 to 18 carbon atoms, or a substituted or unsubstituted cyclic hydrocarbon group having 3 to 8 carbon atoms. In an implementation, $R_4$ may be, e.g., a phenyl group or a methyl group.

In Chemical Formula 2, $R_5$ may be or may include, e.g., a substituted or unsubstituted alkoxy group having 1 to 4 carbon atoms. In an implementation, $R_5$ may be, e.g., a methoxy group or an ethoxy group.

In an implementation, the compound represented by Chemical Formula 2 may be, e.g., phenyltrimethoxysilane, methyltrimethoxysilane, or a mixture thereof In Chemical Formula 3, $R_6$ may be or may include, e.g., a substituted or unsubstituted alkoxy group having 1 to 4 carbon atoms. In an implementation, $R_6$ may be, e.g., a methoxy group or an ethoxy group.

In an implementation, the compound represented by Chemical Formula 3 may be, e.g., tetraethoxysilane.

The silsesquioxane-based copolymer according to the exemplary embodiment may be formed by copolymerizing a compound represented by Chemical Formula 1, and at least one of a compound represented by Chemical Formula 2 and a compound represented by Chemical Formula 3. In an implementation, the order of the arrangement of the polymerized units is not particularly limited. In an implementation, the silsesquioxane-based copolymer may have a random structure, e.g., may be a copolymer having a structure as in the following Structural Formula 1.

[Structural Formula 1]

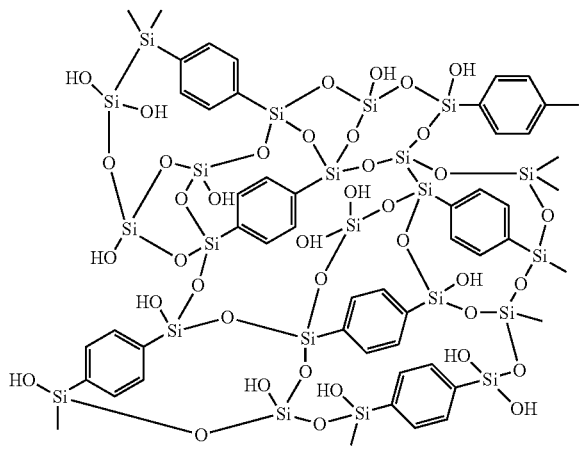

By using the silsesquioxane-based copolymer having the random structure in the photosensitive resin composition, the low heat resistant characteristic may be be obtained, compared to a case of using the silsesquioxane-based copolymer having a cage or ladder structure.

When the photosensitive resin composition having the low heat resistant characteristic is used as a pixel defining layer, excellent reflow characteristic (which may be useful while the electrode and the pixel defining layer are simultaneously patterned) may be obtained, and a detailed description for the patterning process will be given below.

In an implementation, the silsesquioxane-based copolymer according to the present exemplary embodiment may have a weight average molecular weight (Mw) of 2,000 to 10,000, e.g., 2,000 to 4,000. In an implementation, the silsesquioxane-based copolymer according to the present exemplary embodiment may have a degree of dispersion of 1.5 to 5.0 and an acid number of 30 to 300 KOH mg/g.

In an implementation, the silsesquioxane-based copolymer according to the present exemplary embodiment may be included in the composition in an amount of 10 to 50 wt %, based on a total weight of the photosensitive resin composition. Maintaining the amount of the silsesquioxane-based copolymer at 10 wt % or greater helps ensure that the thin film shape is obtained by spin-coating. Maintaining the amount of the silsesquioxane-based copolymer at 50 wt % or less helps ensure that a sufficient photosensitive characteristic is obtained.

The photosensitive resin composition of the exemplary embodiment may include (b) the photosensitive compound. The photosensitive compound of the exemplary embodiment may be a suitable photosensitive compound in a positive resist. In an implementation, the photosensitive compound may include a ballast selected from 2,3,4-trihydroxybenzophenone, 2,4,4'-trihydroxybenzophenone, 2,4,6-trihydroxybenzophenone, 2,3,4-trihydroxy-2'-methylbenzophenone, 2,2',4,4'-tetrahydroxybenzophenone, 2,3,4,4'-tetrahydroxybenzophenone, 4,4',4"-trihydroxyphenylmethane, bis-(4-hydroxyphenyl) methylphenylmethane, 1,1,4-tris-(4-hydroxyphenyl) cyclohexane, 2,2',3,4,4'-pentahydroxybenzophenone, 2,2',3, 4,4',5-hexahydroxybenzophenone, 1,2-benzenediol, or 4-[bis-(5-cyclohexyl-4-hydroxy-2-methylphenyl)methyl]. In an implementation, the ballast may be substituted with, e.g., naphthoquinone-1, a 2-diazide-4-sulfonate ester group, or a naphthoquinone-1,2-diazide-5-sulfonate ester group.

In an implementation, the photosensitive compound may be included in a amount of 5 to 40 wt %, based on a total weight of the photosensitive resin composition, with a view toward optimizing the developing characteristic to an alkali solution of the photoresist. Maintaining the amount of the photosensitive compound at 5 wt % or greater helps ensure that the photosensitive effect is sufficient to obtain a pattern. Maintaining the amount of the photosensitive compound at 40 wt % or less helps ensure that sensitivity is not too low.

The photosensitive resin composition according to the exemplary embodiment may include (c) the solvent. The viscosity of the composition may be properly adjusted by adding the solvent. In an implementation, the viscosity may be, e.g., 3 to 30 cP. The solvent according to the exemplary embodiment may include a suitable solvent that can uniformly dissolve a mixture of the silsesquioxane-based copolymer and the photosensitive compound, and have an excellent coating property.

In an implementation, the solvent may include. e.g., butyl acetate, diethylene glycol dimethyl ethyl ether, methyl methoxy propionate, ethyl ethoxy propionate, ethyl lactate, propylene glycol methyl ether acetate, propylene glycol methyl ether, propylene glycol propyl ether, methyl cellosolve acetate, ethyl cellosolve acetate, diethylene glycol methyl acetate, diethylene glycol ethyl acetate, diethylene glycol ethyl ether, or dipropylene glycol methyl ether.

As described, the photosensitive resin composition may include (a) the silsesquioxane-based copolymer, (b) the photosensitive compound, and (c) the solvent. In an implementation, additional components, e.g., a surfactant, may be included.

In an implementation, the glass transition temperature (Tg) of the photosensitive resin composition according to the exemplary embodiment may be, e.g., about 150° C. to about 200° C. For example, when the composition is applied and forms a layer, a temperature at which a viscosity of the layer decreases enough to reflow may be about 150° C. to about 200° C. Maintaining the glass transition temperature of the photosensitive resin composition at 150° C. or greater helps ensure that insulating layers such as the pixel defining layer including the photosensitive resin composition have sufficient heat resistance, so that the insulating layers may not be damaged during a high temperature process in the manufacturing process of the organic light emitting display device. Maintaining the glass transition temperature of the photosensitive resin composition at 200° C. or less helps ensure that, during a heat treatment process for reflow of the photosensitive resin layer pattern to be described, the temperature does not have to be excessively increased. For example, there could be a limitation on increasing the temperature due to the restriction of the system. Further, in the manufacturing process of the panel, the panel performance could be deteriorated due to a poor distribution caused by the temperature deviation. Further, a ratio of the solvent could be increased in some photosensitive resin compositions to obtain a desirable reflow characteristic, but in this case, the coating property and durability could be deteriorated. However, by using the photosensitive resin composition including the silsesquioxane-based copolymer according to the exemplary embodiment, the desirable reflow characteristic may be obtained without increasing the ratio of the solvent.

As described, the photosensitive resin composition may have a low heat resistance characteristic, and when the photosensitive resin composition is used for the pixel defining layer, the excellent reflow characteristic (which is desirable while the electrode and the pixel defining layer are simultaneously patterned) may be obtained.

Hereinafter, an organic light emitting device including the photosensitive resin composition according to the exemplary embodiment will be described with reference to FIG. 1. FIG. 1 illustrates a cross-sectional view of one pixel of the organic light emitting display device of an exemplary embodiment. FIG. 1 illustrates only one of the pixels, but the organic light emitting display device includes a plurality of pixels.

As shown in FIG. 1, organic light emitting display device according to the exemplary embodiment may include a first substrate 100, a buffer layer 120, a thin film transistor 130, a passivation layer 180, an organic light emitting element 70, a pixel defining layer 190, and a second substrate 200.

The first substrate 100 may be an insulating substrate made of glass and the like. It may further be a flexible substrate, a stretchable substrate, or a rollable substrate made of an organic material such as polyimide, polycarbonate, polyethylene, polyethylene terephthalate, or polyacrylate.

The buffer layer 120 is positioned on the first substrate 100. The buffer layer 120 may be made of at least one material selected from a silicon nitride (SiNx) and a silicon oxide (SiOx), and configured with a single layer or multiple layers. The buffer layer 120 prevents permeation of unnecessary components such as impurities or moisture, and simultaneously flattens the surface.

The thin film transistor 130 is positioned between the buffer layer 120 and the organic light emitting element 70, and is connected with the organic light emitting element 70. As shown FIG. 1, the passivation layer 180 is positioned between the thin film transistor 130 and the organic light emitting element.

FIG. 1 illustrates only one thin film transistor 130 for better understanding and ease of description, but thin film transistors 130 may be connected to at least one scan line, at least one data line, two or more thin film transistors, and at least one capacitor, respectively, which may be connected to the thin film transistor 130 with various suitable structures.

The thin film transistor 130 includes a semiconductor layer 135, a gate electrode 155, a source electrode 176, and a drain electrode 177.

The semiconductor layer 135 is positioned on the buffer layer 120, and may be made of polysilicon or an oxide semiconductor. The semiconductor layer 135 includes a channel region that is not doped with an impurity, a source region, and a drain region. The source region and the drain region are doped with an impurity and disposed at opposite ends of the channel region.

The gate electrode 155 is positioned on the semiconductor layer 135, and corresponds to the channel region. A gate insulating layer 140 is positioned between the semiconductor layer 135 and the gate electrode 155. An interlayer insulating layer 160 is positioned on the gate insulating layer 140, and covers the gate electrode 155.

The source electrode 176 and the drain electrode 177 are formed on the interlayer insulating layer 160. The source electrode 176 and the drain electrode 177 are respectively connected with the source region and the drain region of the semiconductor layer 135 through contact holes provided in the gate insulating layer 140 and the interlayer insulating layer 160.

The gate insulating layer 140 and the interlayer insulating layer 160 may include an inorganic material such as a silicon nitride (SiNx) and a silicon oxide (SiOx).

The passivation layer 180 is positioned on the source electrode 176 and the drain electrode 177. The drain electrode 177 is connected with a first electrode 710 of the organic light emitting element 70 through a contact hole provided in the passivation layer 180.

The organic light emitting element 70 includes the first electrode 710 connected with the drain electrode 177 of the thin film transistor 130, an emission layer 720 positioned on the first electrode 710, and a second electrode 730 positioned on the emission layer 720.

The first electrode 710 may be an anode that is a hole injection electrode, and may have a characteristic of light reflection, light semi-transmission, or light transmission.

The pixel defining layer 190 is positioned on the first electrode 710 and covers an edge of the first electrode 710. The pixel defining layer 190 includes an opening 195 overlapping the first electrode 710. The pixel defining layer 190 may include the silsesquioxane-based copolymer obtained by copolymerizing a compound represented by the following Chemical Formula 1 with at least one of a compound represented by the following Chemical Formula 2 and a compound represented by the following Chemical Formula 3.

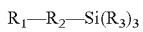    [Chemical Formula 1]

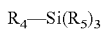    [Chemical Formula 2]

    [Chemical Formula 3]

Herein, $R_1$ may be, e.g., any one selected from an amino group, a hydroxyl group, and a carboxyl group, $R_2$ may be, e.g., any one selected from linear or branched, substituted or unsubstituted alkylene groups having 1 to 5 carbon atoms, $R_3$, $R_5$, and $R_6$ may each independently be, e.g., any one selected from substituted or unsubstituted alkoxy groups having 1 to 4 carbon atoms, and $R_4$ may be, e.g., any one selected from linear or branched, substituted or unsubstituted alkylene groups having 1 to 5 carbon atoms, substituted or unsubstituted aromatic hydrocarbon groups having 6 to 18 carbon atoms, and substituted or unsubstituted cyclic hydrocarbon groups having 3 to 8 carbon atoms.

In an implementation, the silsesquioxane-based copolymer included in the pixel defining layer 190 may be substantially the same as the silsesquioxane-based copolymer described above.

The emission layer 720 may be positioned on the first electrode 710 in the opening 195 of the pixel defining layer 190.

The emission layer 720 may be formed of multilayers including an emission layer, and one and more of a hole injection layer (HIL), a hole transport layer (HTL), an electron transport layer (ETL), and an electron injection layer (EIL). In the case where the emission layer 720 includes all of the layers, the hole injection layer may be positioned on the first electrode 710 that is the anode, and the hole transporting layer, the emission layer, the electron transporting layer, and the electron injection layer may be sequentially laminated thereon.

In this case, the emission layer may include a red emission layer emitting red light, a green emission layer emitting green light, and a blue emission layer emitting blue light, and the red emission layer, the green emission layer, and the blue emission layer are respectively formed in a red pixel, a green pixel, and a blue pixel to implement a color image.

The second electrode 730 is positioned on the pixel defining layer 190 and the emission layer 720, and may be commonly formed for a plurality of pixel areas. The second electrode 730 may be a cathode serving as an electron injection electrode, and may have light reflectivity, light transflectivity, or light transmissivity.

The second substrate 200 is positioned on the first electrode 710, the emission layer 720, and the second electrode 730 to protect the first electrode 710, the emission layer 720, and the second electrode 730. A thin film encapsulation layer (not shown) may be further included between the second substrate 200 and the organic light emitting element 70, and has a structure formed by alternately laminating one or more organic layers and one or more inorganic layers.

Hereinafter, a method for manufacturing the organic light emitting display device according to the exemplary embodiment will be described with reference to FIG. 2A to 2F. For example, a process of forming the pixel defining layer 190 and the first electrode 710 by using the photosensitive resin composition according to the exemplary embodiment will be described.

FIG. 2A to 2F illustrate cross-sectional views of stages in a method for manufacturing an organic light emitting display device according to the exemplary embodiment.

Figure 2A:
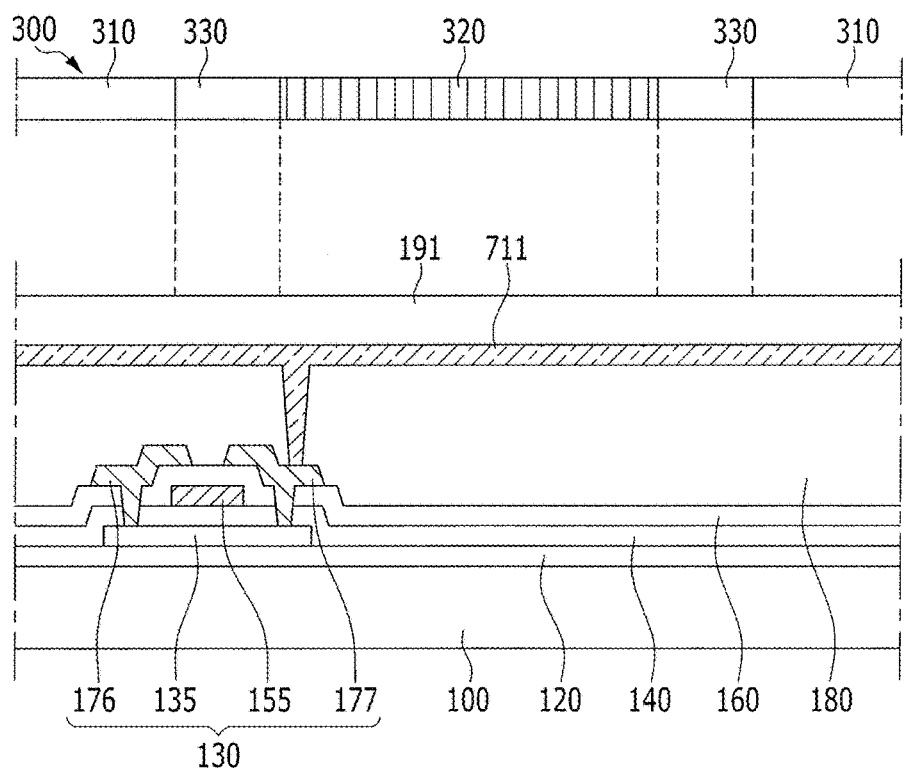
FIG. 2A to 2F illustrate cross-sectional views of stages in a method for manufacturing an organic light emitting display device according to the exemplary embodiment.

As shown in FIG. 2A, a first electrode material layer 711 and a photosensitive resin layer 191 may be sequentially provided on the first substrate 100 on which the buffer layer 120, the thin film transistor 130, and the passivation layer 180 are formed.

The photosensitive resin layer 191 may be made of the photosensitive resin composition described above. For example, the composition may include (a) a silsesquioxane-based copolymer obtained by copolymerizing a compound represented by the following Chemical Formula 1, and at least one of a compound represented by the following Chemical Formula 2 and a compound represented by the following Chemical Formula 3, (b) a photosensitive compound, and (c) a solvent.

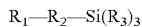    [Chemical Formula 1]

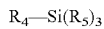    [Chemical Formula 2]

    [Chemical Formula 3]

Herein, $R_1$ may be, e.g., any one selected from an amino group, a hydroxyl group, and a carboxyl group, $R_2$ may be, e.g., any one selected from linear or branched, substituted or unsubstituted alkylene groups having 1 to 5 carbon atoms, $R_3$, $R_5$, and $R_6$ may each independently be, e.g., any one selected from substituted or unsubstituted alkoxy groups having 1 to 4 carbon atoms, and $R_4$ may be, e.g., any one selected from linear or branched, substituted or unsubstituted alkylene groups having 1 to 5 carbon atoms, substituted or unsubstituted aromatic hydrocarbon groups having 6 to 18 carbon atoms, and substituted or unsubstituted cyclic hydrocarbon groups having 3 to 8 carbon atoms.

In an implementation, the photosensitive rein composition may be applied by spin coating, slit and spin coating, slit coating, or roll coating on the first substrate 100 on which first electrode material 711 is formed.

Then, the photosensitive resin layer 191 may be exposed by using a halftone mask 300. In this case, a region in which the pixel defining layer 190 (refer to FIG. 2E) will be formed, a region which will become the first electrode 710 (refer to FIG. 2E) in which the first electrode material layer 711 remains, and a region in which the first electrode material layer 711 will be removed may be exposed to different degrees by the halftone mask 300.

For example, the halftone mask 300 may include a first light transmitting portion 310 for allowing almost all (e.g., about 100%) of light to pass therethrough, a second light transmitting portion 320 for allowing a part (e.g., about 50%) of light to pass therethrough, and a light blocking portion 330 for allowing substantially no light (e.g., about 0%) to pass therethrough. The halftone mask 500 may be disposed to perform exposure so that the first light transmitting portion 310 corresponds to or overlies a region where the first electrode material layer 711 will be entirely removed, the second light transmitting portion 320 corresponds to or overlies a region where the first electrode material layer 711 remains to be the first electrode 710, and the light blocking portion 330 corresponds to or overlies a region where the pixel defining layer 190 will be formed.

Figure 2B:
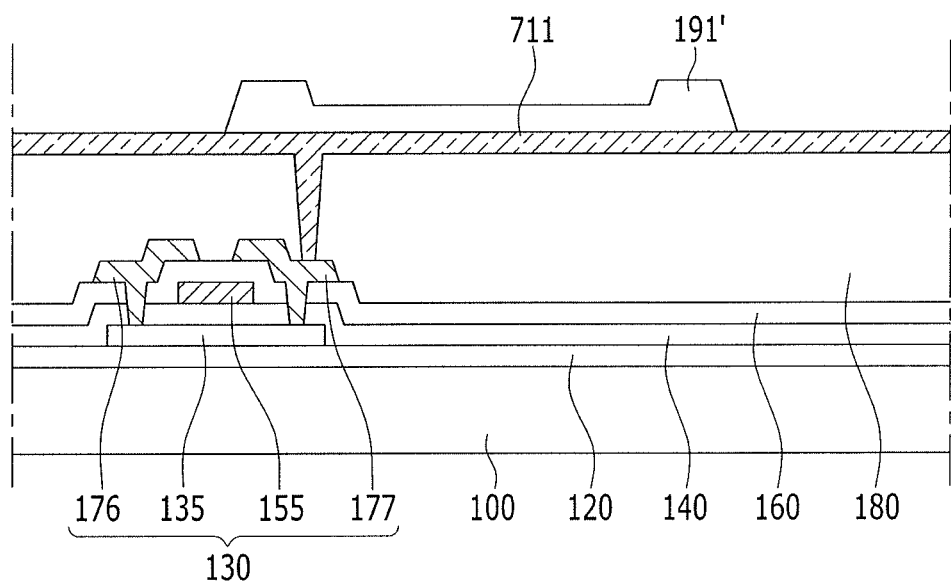

As shown in FIG. 2B, the photosensitive resin layer 191 may be entirely removed from the portion that is exposed 100% by the first light transmitting portion 310 so the first electrode material layer 711 may be exposed, part of the photosensitive resin layer 191 may be maintained in the portion that is exposed 50% by the second light transmitting portion 320, and the photosensitive resin layer 191 may remain as it originally was in the portion at which light is entirely blocked by the light blocking portion 330 so a photosensitive resin layer pattern 191' may be formed.

Figure 2C:
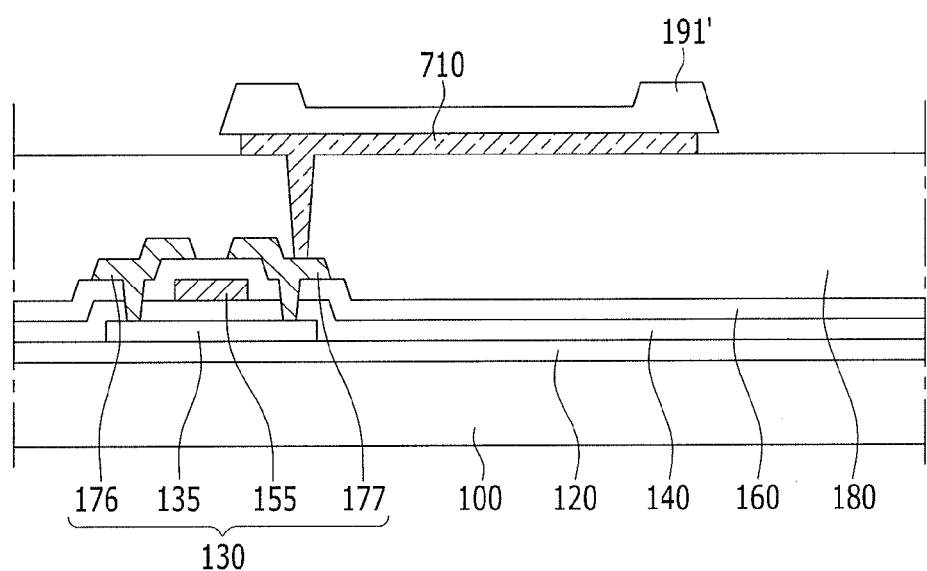

In this state, the first electrode material layer 711 may be etched and removed at the exposed portion, so a shape of the first electrode 710 may be formed as shown in FIG. 2C. At this stage, wet etching may be used. According to this, the shape of the first electrode 710 may be completely formed and an edge of the first electrode 710 may be partially exposed. Accordingly, if the second electrode 730 were to be laminated in this state, the second electrode 730 could contact the first electrode 710 to cause a short, so the exposed edge may first be covered.

Figure 2D:
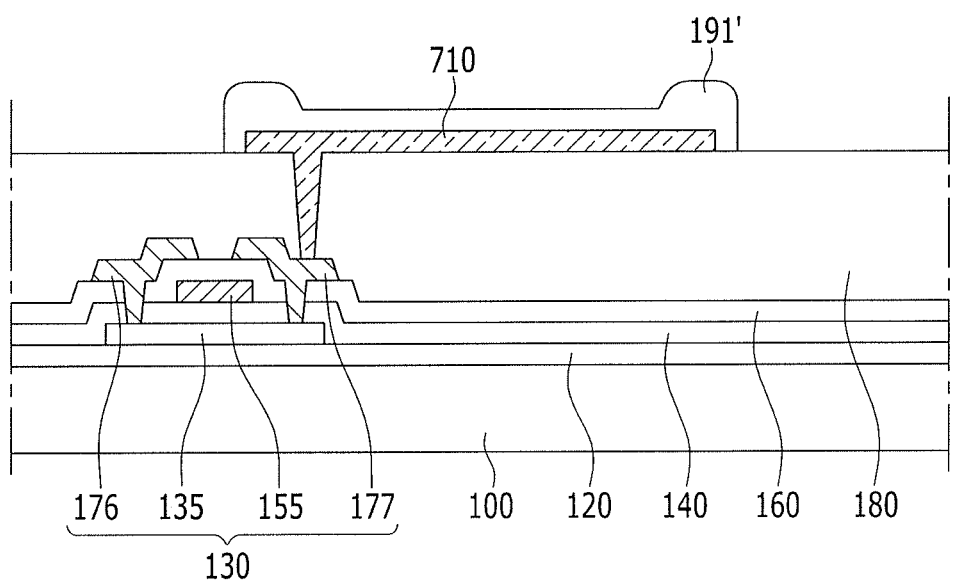

For example, a thermal reflow process may be performed by heating the photosensitive resin layer pattern 191' remaining on the first electrode 710. For example, by conducting a heat treatment, the photosensitive resin layer pattern 191' may be melted and may flow down to entirely cover the edge of the first electrode 710 as shown in FIG. 2D, and then the photosensitive resin layer pattern 191' may be cured.

In this case, the photosensitive resin layer pattern 191' may be made of the photosensitive resin composition according to the exemplary embodiment, which has a glass transition temperature (Tg) of about 150° C. to 200° C., and a good reflow process may be performed without an excessive heat temperature during the thermal reflow process. For example, in the exemplary embodiment, the heat treatment may be performed at a temperature of about 200° C. to 250° C. for about 1 hour in order to cover the edge of the first electrode 710 by reflowing the photosensitive resin layer pattern 191'. As described, even though the reflow process may be performed at a relatively low temperature, the photosensitive resin layer pattern 191' including the photosensitive composition according to the exemplary embodiment may exhibit an excellent reflow characteristic.

Figure 2E:
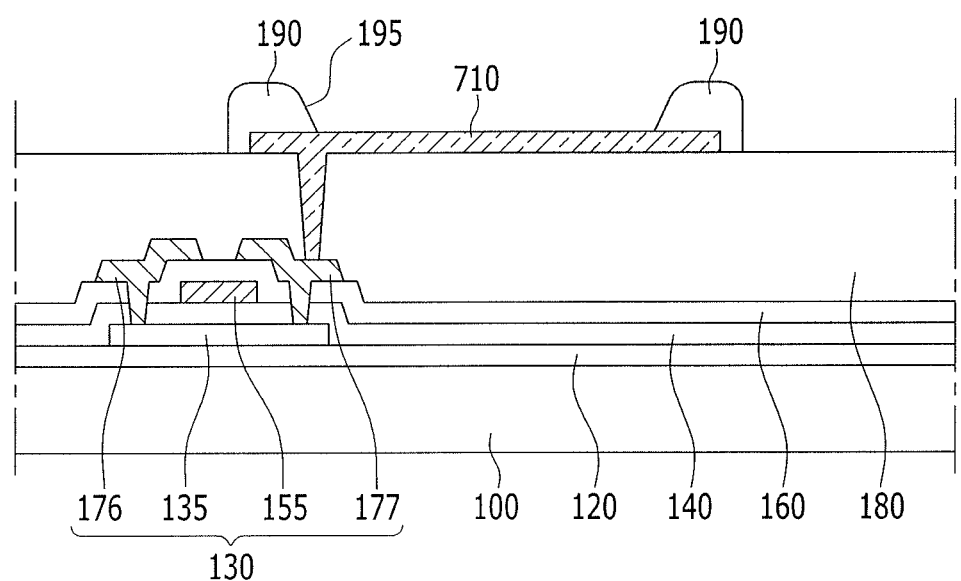

Next, a portion of the maintained photosensitive resin layer pattern 191' on the first electrode 710 may be removed by ashing, so as to expose, e.g., a central portion of, the first electrode 710. For example, as shown in FIG. 2E, the first electrode 710 may be exposed (except the edge portion) by removing the photosensitive resin layer pattern 191', so that the pixel defining layer 190 having an opening 195 overlapping the first electrode 710 may be formed. In an implementation, dry ashing may be used.

Figure 2F:
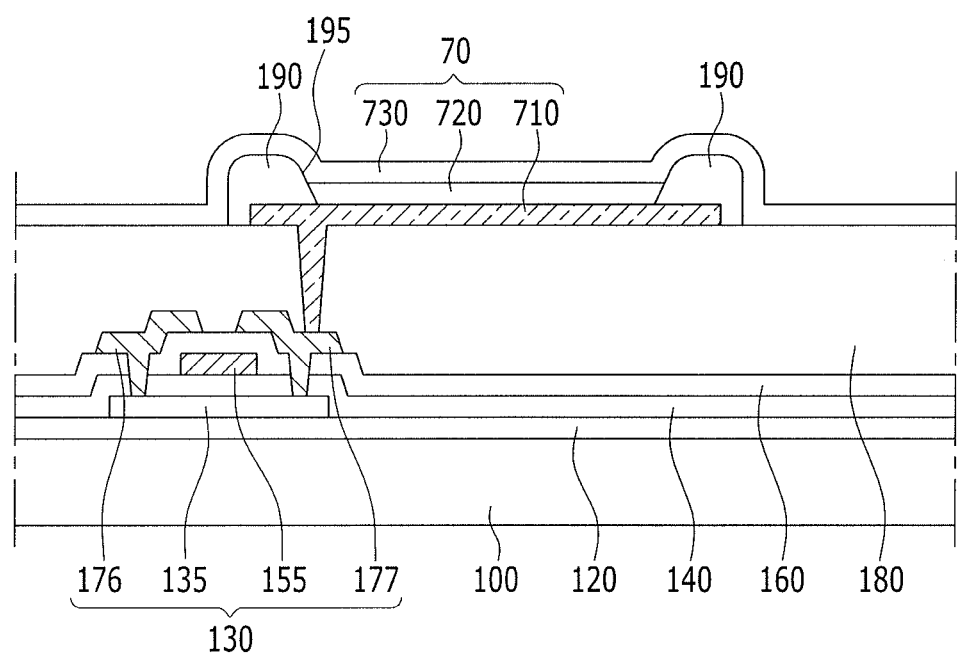

Next, as shown in FIG. 2F, the emission layer 720 may be formed in the opening 195, and the second electrode 730 may be formed on the pixel defining layer 190 and the emission layer 720 so that the organic light emitting element 70 is formed. Next, the second substrate (200, shown in FIG. 1) may be bonded to the first substrate 100 on which the organic light emitting element 70 is formed, so that the organic light emitting display device is completed.

As described, according to the manufacturing method, the first electrode 710 and the pixel defining layer 190 may be formed by using only a single mask process, and the process may be simplified compared to another process that separately uses two mask processes.

For example, the photosensitive resin composition according to the exemplary embodiment may have a low heat resistant property, and when the photosensitive resin layer 191 is formed and the thermal reflow process is performed by using the photosensitive resin composition, the good reflow process may be performed without an excessively high temperature (e.g., which could damage components of the device). Hereinafter, manufacture of the photosensitive resin composition according to the exemplary embodiment, application of the same applied to the pixel defining layer, and testing results thereof will be described.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHESIS EXAMPLE 1

Manufacturing of Silsesquioxane-base Copolymer (3-aminopropyl)triethoxysilane (53.79 g, 0.03 mol), phenyltrimethoxysilane (39.66 g, 0.20 mol), methyltrimethoxysilane (13.62 g, 0.10 mol), tetraethoxysilane (20.83 g, 0.10 mol), and 200 g of propylene glycol monomethyl ether acetate were added to a 2 L flask having a funnel, a cooling pipe, and an agitator, and then 20 g of a 0.5 normal HCl water solution were added while agitating the solution.

The temperature of the reaction solution was increased to 70° C. and the reaction solution was agitated for 18 h. After finishing the reaction, distilled water was added to collect the organic phase by phase separation, so that 120 g of the silsesquioxane-based copolymer was formed. As a result of measurement by using gel permeation chromatography (GPC), the weight average molecular weight of the silsesquioxane-based copolymer was 3,000.

Exemplary Embodiment (Manufacturing of Photosensitive Resin Composition)

While blocking ultraviolet (UV) rays, (a) 100 parts by weight by solid content ratio of the silsesquioxane-based copolymer manufactured in Synthesis 1, (b) 20 parts by weight of 2,3,4,4'-tetrahydroxyphenone1,2-naphthoquinonediazide-5-sulfonate as the photosensitive compound, and 0.5 parts by weight of a silicon-based surfactant were dissolved in (c) propylene glycol monomethyl ether acetate as the solvent so that the solid content was 30 wt %, and filtered by a PTFE membrane filter having a pore size of 0.1 μm to obtain the liquefied photosensitive resin composition.

Test

The glass transition temperature (Tg) of the photosensitive resin composition manufactured in the exemplary embodiment was 152° C.

The photosensitive resin composition manufactured in the exemplary embodiment was spin-coated on a glass substrate and patterned to form a photosensitive resin layer pattern, and then the photosensitive resin layer pattern underwent a heat treatment at a temperature of about 200° C. for one hour. A height and a width of the obtained pixel defining layer were measured.

As a Comparative Example, a polyimide (PI)-based photosensitive resin composition, which may be used as a pixel defining layer, was manufactured. For manufacturing the polyimide-based photosensitive resin composition, a polyimide having a monomer represented by the following Chemical Formula 4 was used, instead of the silsesquioxane-based copolymer of the Exemplary Embodiment.

[Chemical Formula 6]

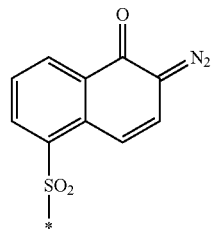

In the Comparative Example, 100 parts by weight of polyimide and about 20 parts by weight of the photosensitive compound were dissolved in a solvent so that the solid content was 10 wt % to manufacture the PI-based photosensitive resin composition. As a solvent, a mixed solvent by mixing gamma-butyrolactone, ethyl lactate, and propylene glycol monomethyl ether acetate in a weight ratio of 10:20:70 was used.

The glass transition temperature (Tg) of the PI-based photosensitive resin composition was 280° C.

The obtained PI-based photosensitive resin composition was spin-coated on a glass substrate and patterned to form a photosensitive resin layer pattern, and then the photosensitive resin layer pattern underwent a heat treatment at a temperature of about 200° C. for one hour, by the same method as in the Exemplary Embodiment. A height and a width of the obtained pixel defining layer were measured.

The results of the measurements regarding the height and the width of the pixel defining layers are shown in FIGS. 3A-3C and FIGS. 4A-4C.

[Chemical Formula 4]

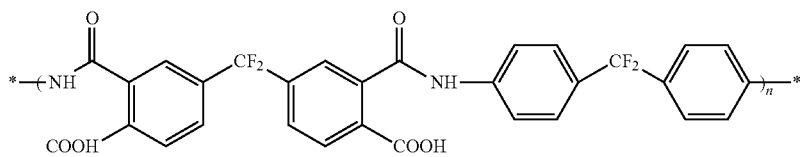

Further, as a photosensitive compound, a compound represented by the following Chemical Formula 5 was used.

[Chemical Formula 5]

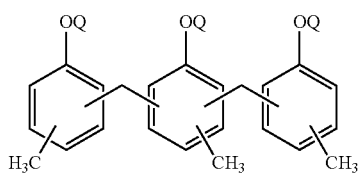

Q is a substituent represented by the following Chemical Formula 6, and is included at 75% compared to the ballast represented by Chemical Formula 5.

Figure 3A:
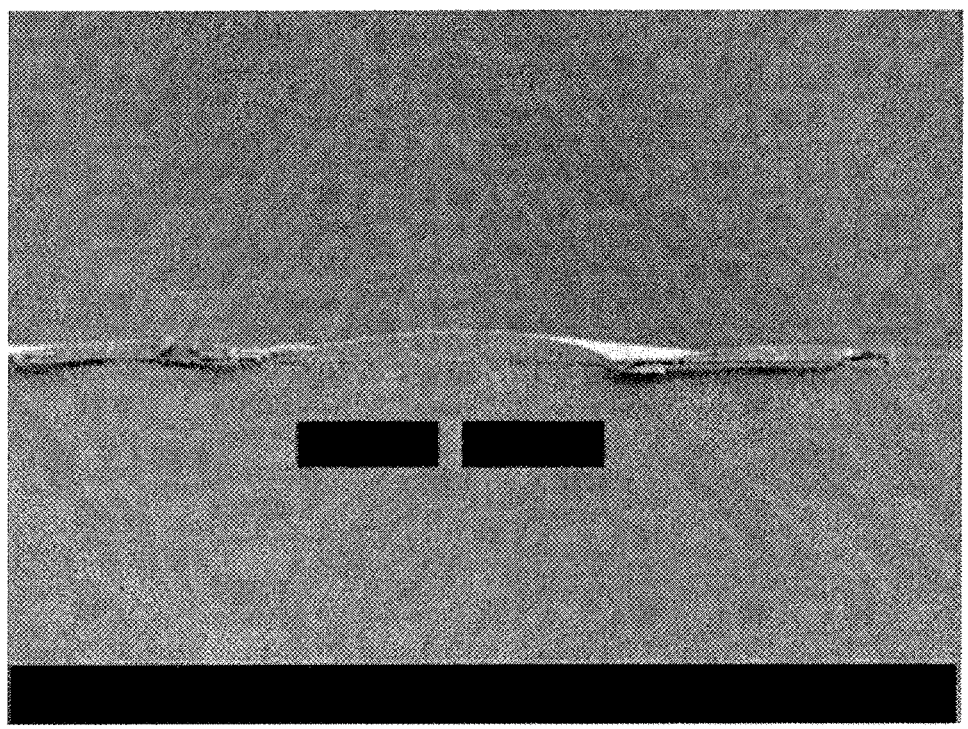
FIG. 3A to FIG. 3C illustrate cross-sectional images and a graph showing heights of pixel defining layers formed by using the photosensitive resin composition according to the Exemplary Embodiment and the Comparative Example.
Figure 3B:
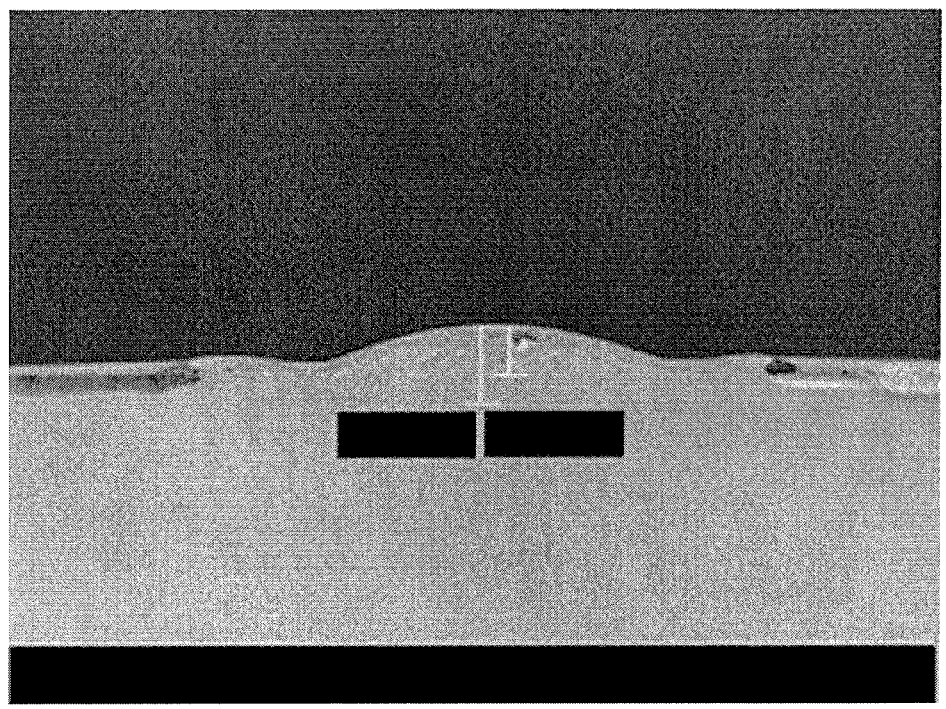

FIG. 3A illustrates an image of the vertical cross-section of the pixel defining layer formed by using the photosensitive resin composition according to the Exemplary Embodiment, and FIG. 3B illustrates an image of the vertical cross-section of the pixel defining layer formed by using the PI-based composition according to the Comparative Example.

Although the heat treatments were performed under the same conditions, an enough reflow was generated in the pixel defining layer formed by using the photosensitive resin composition according to the Exemplary Embodiment, as shown in FIG. 3A, so the height of the pixel defining layer was lower than the height of the pixel defining layer of the Comparative Example of FIG. 3B.

When the reflow was not sufficient as shown FIG. 3B, the edge of the first electrode 710 was not covered by the pixel defining layer, so a defect may be caused.

Figure 3C:
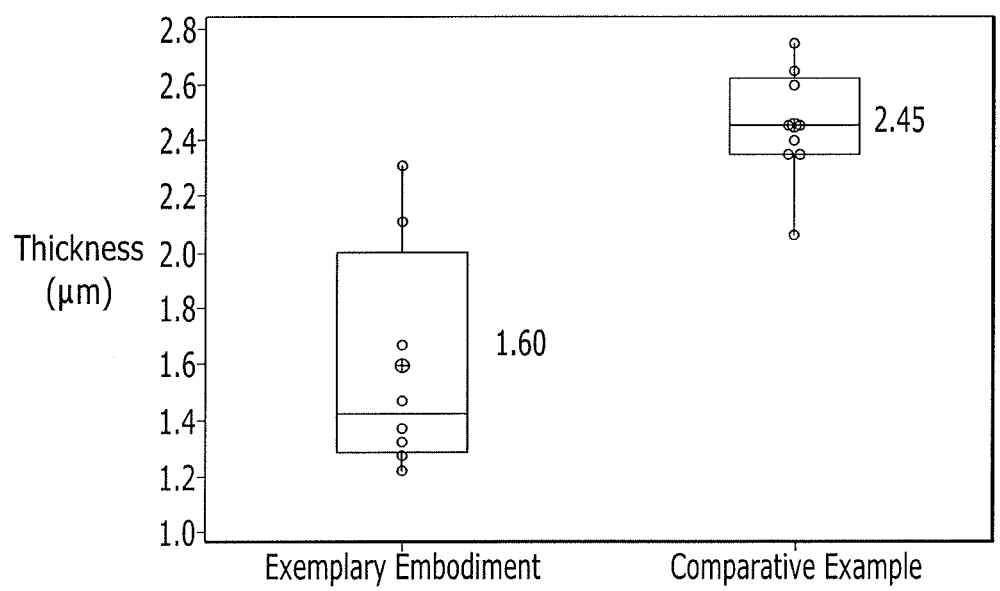

FIG. 3C illustrates a graph showing the heights of the cross-sections in FIG. 3A and FIG. 3B. As shown in FIG. 3C, the average height of the pixel defining layer formed by using the photosensitive resin composition according to the Exemplary Embodiment was about 1.60 μm, while the average height of the pixel defining layer formed by using the PI-based composition according to the Comparative Example was about 2.45 µm. Accordingly, when the photosensitive resin composition according to the Exemplary Embodiment was used, the generation of sufficient reflow was observed.

Figure 4A:
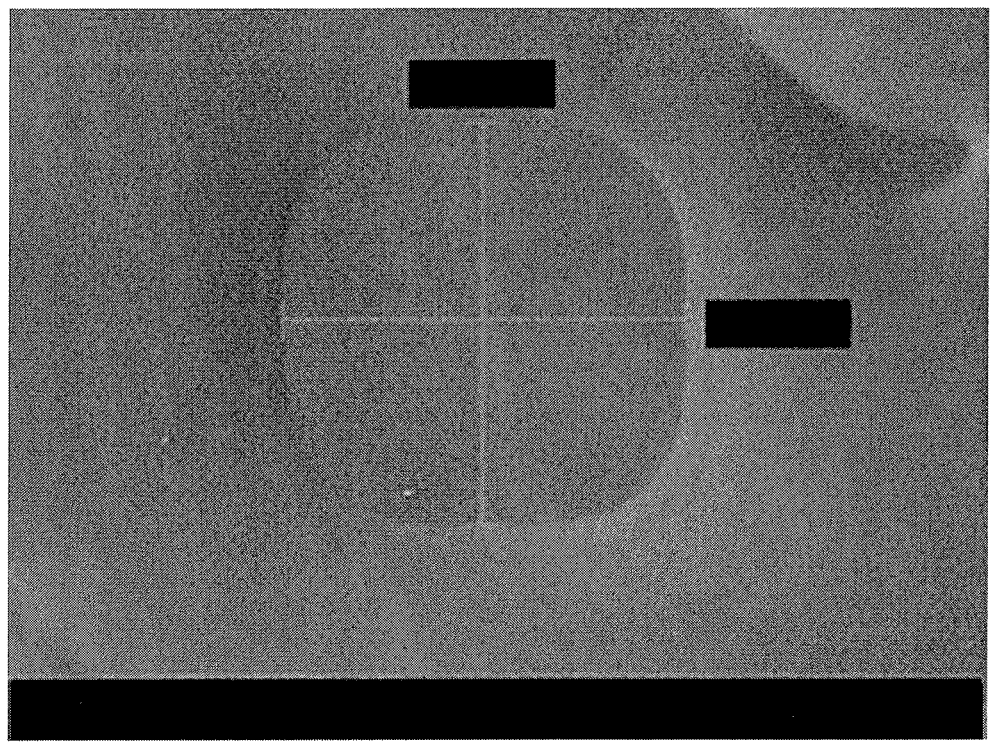
FIG. 4A to FIG. 4C illustrate plan view images and a graph showing widths of pixel defining layers formed by using the photosensitive resin composition according to the Exemplary Embodiment and the Comparative Example.
Figure 4B:
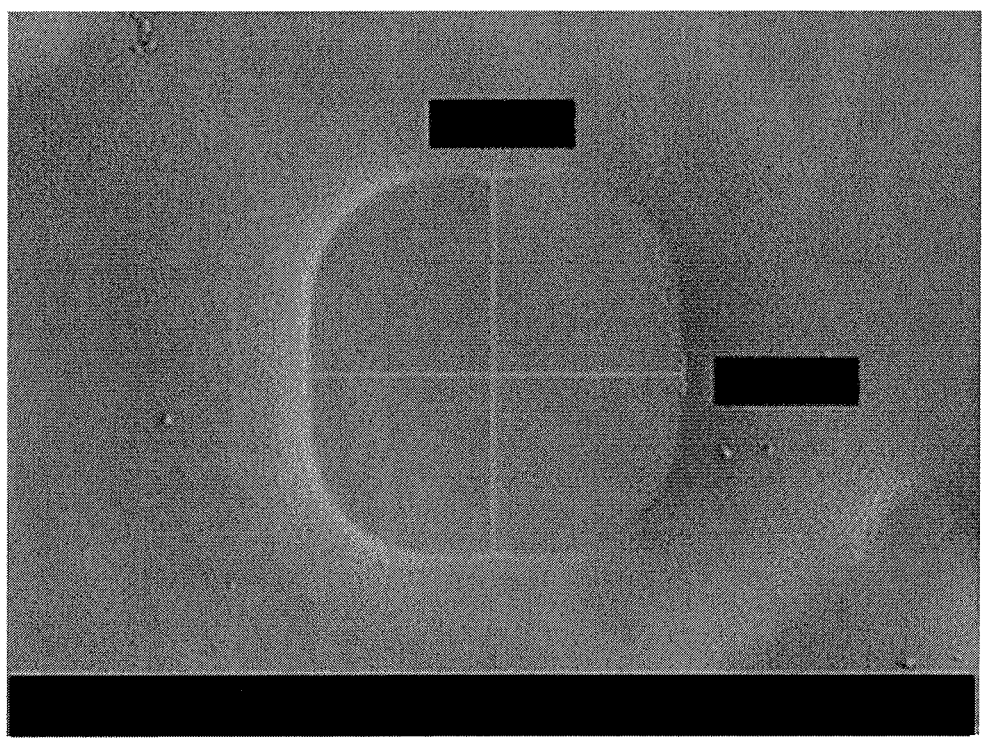

FIG. 4A illustrates an image of a plan view of the pixel defining layer formed by using the photosensitive resin composition according to the Exemplary Embodiment, and FIG. 4B illustrates an image of a plan view of the pixel defining layer formed by using the PI-based composition according to the Comparative Example. Although the heat treatments were performed under the same conditions, sufficient reflow was generated in the pixel defining layer formed by using the photosensitive resin composition according to the Exemplary Embodiment, as shown in FIG. 4A, so the width of the pixel defining layer was larger than the width of the pixel defining layer of the Comparative Example of FIG. 4B. When the reflow was not sufficient as shown FIG. 4B, the edge of the first electrode 710 was not covered by the pixel defining layer, so a defect may be caused.

Figure 4C:
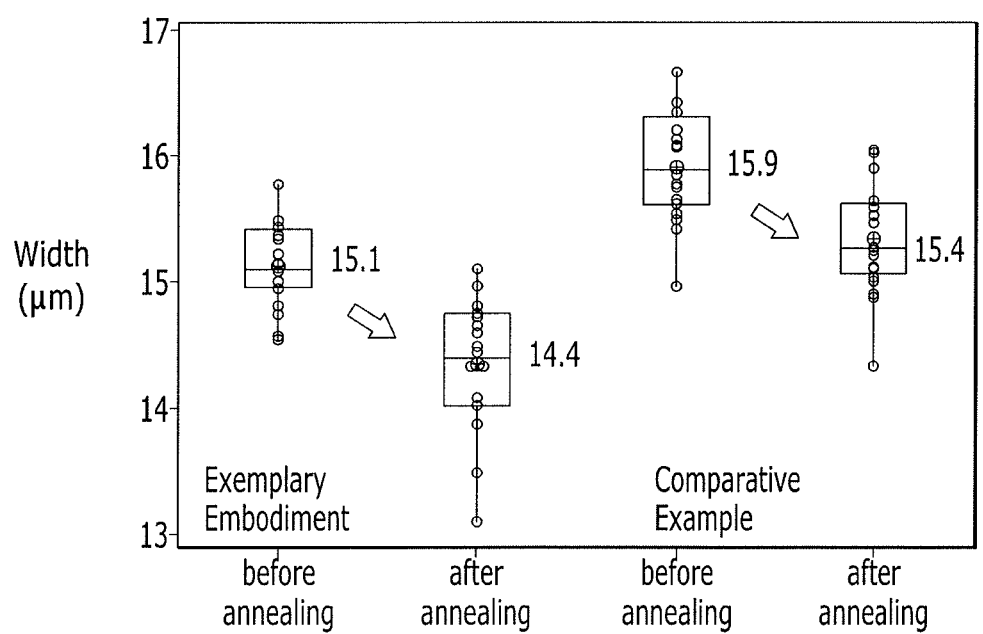

FIG. 4C illustrates a graph showing the widths of the plane view in FIG. 4A and FIG. 4B. As shown in FIG. 4C, in the pixel defining layer formed by using the photosensitive resin composition according to the Exemplary Embodiment, the width difference of before and after the heat treatment was about 0.7 µm, while in the pixel defining layer formed by using the PI-based composition according to the Comparative Example, the width difference of before and after the heat treatment was about 0.5 µm. Accordingly, when the photosensitive resin composition according to the Exemplary Embodiment was used, the generation of sufficient reflow was observed.

By way of summation and review, for the organic light emitting display device, a photosensitive resin layer may be used to form a structure having a certain shape. High thermal resistance may be a desirable characteristic of the photosensitive resin layer. However, various manufacturing methods of the organic light emitting display device have been considered for reducing cost, and so on, so that the photosensitive resin layer may exhibit various characteristics.

The embodiments may provide a low heat resistant photosensitive resin composition having an excellent reflow characteristic.

According to an embodiment, a low heat resistant photosensitive resin composition having an excellent reflow characteristic, an organic light emitting display device including the same, and a manufacturing method of the organic light emitting display device may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

| <Description of symbols> | |
|---|---|
| 70 organic light emitting element | 710 first electrode |
| 720 emission layer | 730 second electrode |
| 190 pixel defining layer | 191 photosensitive resin layer |

What is claimed is:

1. A photosensitive resin composition, comprising:
   a photosensitive compound;
   a solvent; and
   a silsesquioxane-based copolymer, the silsesquioxane-based copolymer being obtained by copolymerizing a compound represented by the following Chemical Formula 1 with at least one of:
   a compound represented by the following Chemical Formula 2, and
   a compound represented by the following Chemical Formula 3;

$R_1-R_2-Si(R_3)_3$  [Chemical Formula 1]

$R_4-Si(R_5)_3$  [Chemical Formula 2]

$Si(R_6)_4$  [Chemical Formula 3]

wherein, in Chemical Formulae 1 to 3,
   $R_1$ is an amino group, or a carboxyl group,
   $R_2$ is a linear or branched and substituted or unsubstituted alkylene group having 1 to 5 carbon atoms,
   $R_3$, $R_5$, and $R_6$ are each independently a substituted or unsubstituted alkoxy group having 1 to 4 carbon atoms,
   $R_4$ is a linear or branched and substituted or unsubstituted alkylene group having 1 to 5carbon atoms, a substituted or unsubstituted aromatic hydrocarbon group having 6 to 18 carbon atoms, or a substituted or unsubstituted cyclic hydrocarbon group having 3 to 8 carbon atoms.

2. The photosensitive resin composition as claimed in claim 1, wherein the silsesquioxane-based copolymer has a weight average molecular weight (Mw) of 2,000 to 10,000.

3. The photosensitive resin composition as claimed in claim 1, wherein the silsesquioxane-based copolymer has a degree of dispersion of 1.5 to 5.0.

4. The photosensitive resin composition as claimed in claim 1, wherein the silsesquioxane-based copolymer has an acid number of 30 to 300 KOH mg/g.

5. The photosensitive resin composition as claimed in claim 1, wherein the composition includes:
   20 to 50 wt % of the silsesquioxane-based copolymer,
   20 to 30 wt % of the photosensitive compound, and
   20 to 60 wt % of the solvent.

6. The photosensitive resin composition as claimed in claim 1, wherein the photosensitive resin composition has a glass transition temperature (Tg) of 150° C. to 200° C.

7. The photosensitive resin composition as claimed in claim 1, wherein the photosensitive resin composition has viscosity of 3 to 30 Cp.

8. The photosensitive resin composition as claimed in claim 1, wherein the compound represented by Chemical Formula 1 is (3-aminopropyl)triethoxysilane.

9. The photosensitive resin composition as claimed in claim 1, wherein the compound represented by Chemical Formula 2 includes phenyltrimethoxysilane or methyltriethoxysilane.

10. The photosensitive resin composition as claimed in claim 1, wherein the compound represented by Chemical Formula 3 is tetraethoxysilane.

11. The photosensitive resin composition as claimed in claim 1, wherein the photosensitive compound includes a ballast selected from 2,3,4-trihydroxybenzophenone, 2,4,4'-trihydroxybenzophenone, 2,4,6-trihydroxybenzophenone, 2,3,4-trihydroxy-2'-methylbenzophenone, 2,2',4,4'-tetrahydroxybenzophenone, 2,3,4,4'-tetrahydroxybenzophenone, 4,4',4''-trihydroxyphenylmethane, bis-(4-hydroxyphenyl) methylphenylmethane, 1,1,4-tris-(4-hydroxyphenyl)cyclohexane, 2,2',3,4,4'-pentahydroxybenzophenone, 2,2',3,4,4',5-hexahydroxybenzophenone, 1,2-benzenediol, and 4-[bis-(5-cyclohexyl-4-hydroxy-2-methylphenyl)methyl], the ballast being substituted with naphthoquinone-1, a 2-diazide-4-sulfonate ester group, or a naphthoquinone-1,2-diazide-5-sulfonate ester group.

12. The photosensitive resin composition as claimed in claim 1, wherein the solvent includes butyl acetate, diethylene glycol dimethyl ethyl ether, methyl methoxy propionate, ethyl ethoxy propionate, ethyl lactate, propylene glycol methyl ether acetate, propylene glycol methyl ether, propylene glycol propyl ether, methyl cellosolve acetate, ethyl cellosolve acetate, diethylene glycol methyl acetate, diethylene glycol ethyl acetate, diethylene glycol ethyl ether, or dipropylene glycol methyl ether.

13. The photosensitive resin composition as claimed in claim 1, wherein the silsesquioxane-based copolymer has a random structure.

14. An organic light emitting display device, comprising:
a first electrode electrically connected to a thin film transistor;
a second electrode overlapping the first electrode;
a pixel defining layer between the first electrode and the second electrode, the pixel defining layer having an opening overlapping the first electrode; and
an emission layer between the first electrode and the second electrode in the opening,
wherein the pixel defining layer includes a silsesquioxane-based copolymer obtained by copolymerizing a compound represented by the following Chemical Formula 1 with at least one of:
a compound represented by the following Chemical Formula 2, and
a compound represented by the following Chemical Formula 3:

  [Chemical Formula 1]

  [Chemical Formula 2]

  [Chemical Formula 3]

wherein, in Chemical Formulae 1 to 3,
$R_1$ is an amino group, or a carboxyl group,
$R_2$ is a linear or branched and substituted or unsubstituted alkylene group having 1 to 5 carbon atoms,
$R_3$, $R_5$, and $R_6$ are each independently a substituted or unsubstituted alkoxy group having 1 to 4 carbon atoms,
$R_4$ is a linear or branched and substituted or unsubstituted alkylene group having 1 to 5 carbon atoms, a substituted or unsubstituted aromatic hydrocarbon group having 6 to 18 carbon atoms, or a substituted or unsubstituted cyclic hydrocarbon group having 3 to 8 carbon atoms.

15. The organic light emitting display device as claimed in claim 14, wherein the pixel defining layer covers an edge of the first electrode.

16. The organic light emitting display device as claimed in claim 14, wherein the silsesquioxane-based copolymer has:
a weight average molecular weight (Mw) of 2,000 to 10,000,
a degree of dispersion of 1.5 to 5.0, and
an acid number of 30 to 300 KOH mg/g.

17. A method for manufacturing an organic light emitting display device, the method comprising:
applying a photosensitive resin composition on a first electrode material layer to form a photosensitive resin layer;
patterning the photosensitive resin layer to form the photosensitive resin layer pattern;
patterning the first electrode material layer by using the photosensitive resin layer pattern as a mask to form a first electrode; and
forming a pixel defining layer covering an edge of the first electrode by heating the photosensitive resin layer pattern,
wherein the photosensitive resin composition includes:
a photosensitive compound;
a solvent; and
a silsesquioxane-based copolymer, the silsesquioxane-based copolymer being obtained by copolymerizing a compound represented by the following Chemical Formula 1 with at least one of:
a compound represented by the following Chemical Formula 2, and
a compound represented by the following Chemical Formula 3;

  [Chemical Formula 1]

  [Chemical Formula 2]

  [Chemical Formula 3]

wherein, in Chemical Formulae 1 to 3,
$R_1$ is an amino group, or a carboxyl group,
$R_2$ is a linear or branched and substituted or unsubstituted alkylene group having 1 to 5 carbon atoms,
$R_3$, $R_5$, and $R_6$ are each independently a substituted or unsubstituted alkoxy group having 1 to 4 carbon atoms,
$R_4$ is a linear or branched and substituted or unsubstituted alkylene group having 1 to 5 carbon atoms, a substituted or unsubstituted aromatic hydrocarbon group having 6 to 18 carbon atoms, or a substituted or unsubstituted cyclic hydrocarbon group having 3 to 8 carbon atoms.

18. The method for manufacturing an organic light emitting device as claimed in claim 17, wherein the heating is performed at a temperature of 200° C. to 250° C. for one hour.

19. The method for manufacturing an organic light emitting device as claimed in claim 17, wherein the patterning of the photosensitive resin layer is performed by using a mask, the mask including:
a first light transmitting portion allowing about 100% of light to pass therethrough,
a second light transmitting portion allowing about 50% of light to pass therethrough, and
a light blocking portion blocking light from passing therethrough.

20. The method for manufacturing an organic light emitting device as claimed in claim 19, wherein:
the first electrode material layer and the photosensitive resin layer are entirely removed in a portion aligned with the first light transmitting portion;
the photosensitive resin layer is removed to expose the first electrode in a portion aligned with the second light transmitting portion; and
the photosensitive resin layer remains in a portion aligned the light blocking portion.

* * * * *